(12) United States Patent
Efferenn et al.

(10) Patent No.: US 6,770,530 B2
(45) Date of Patent: Aug. 3, 2004

(54) METHOD FOR PRODUCING A SHALLOW TRENCH ISOLATION FOR N- AND P-CHANNEL FIELD-EFFECT TRANSISTORS IN A SEMICONDUCTOR MODULE

(75) Inventors: Dirk Efferenn, Dresden (DE); Hans-Peter Moll, Dresden (DE); Andreas Wich-Glasen, Langebrück (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/385,000

(22) Filed: Mar. 10, 2003

(65) Prior Publication Data

US 2003/0181019 A1 Sep. 25, 2003

(30) Foreign Application Priority Data

Mar. 9, 2002 (DE) ......................................... 102 10 434

(51) Int. Cl.$^7$ .......................................... H01L 21/8242
(52) U.S. Cl. ........................ 438/248; 438/391; 438/424
(58) Field of Search .................. 257/374; 438/238–248, 438/394, 400–407, 424–433

(56) References Cited

U.S. PATENT DOCUMENTS

| 6,482,715 B2 | * | 11/2002 | Park et al. | ................... 438/424 |
| 6,486,517 B2 | * | 11/2002 | Park | ........................... 257/374 |
| 2002/0098649 A1 | | 7/2002 | Chien et al. | |

FOREIGN PATENT DOCUMENTS

EP           0 739 033 A2    10/1996

* cited by examiner

Primary Examiner—Matthew Smith
Assistant Examiner—Calvin Lee
(74) Attorney, Agent, or Firm—Laurence A. Greenberg; Werner H. Stemer; Ralph E. Locher

(57) ABSTRACT

The method for producing a shallow trench isolation for n- and p-channel field-effect transistors in a semiconductor module provides the following steps. A thermal oxide layer is applied in isolation trenches. A nitride liner is subsequently applied. In a further step, a mask is applied in the region in which n-channel field-effect transistors are intended to be produced. The nitride liner is removed around the mask. Finally, the mask is also removed. As a result, the properties of the n-channel field-effect transistors are improved, without impairing the properties of the p-channel field-effect transistors.

10 Claims, 9 Drawing Sheets

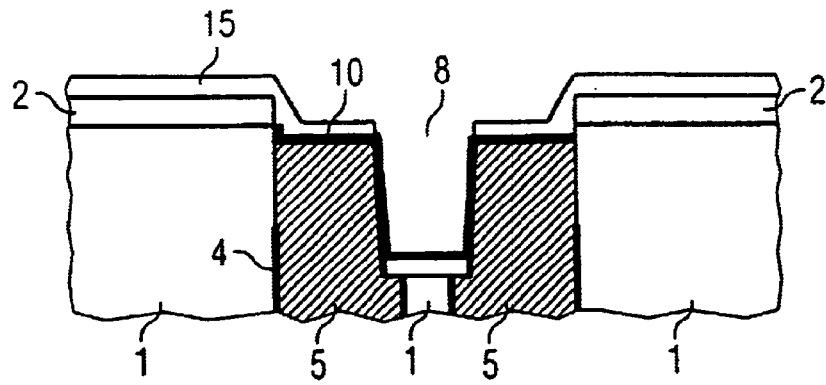
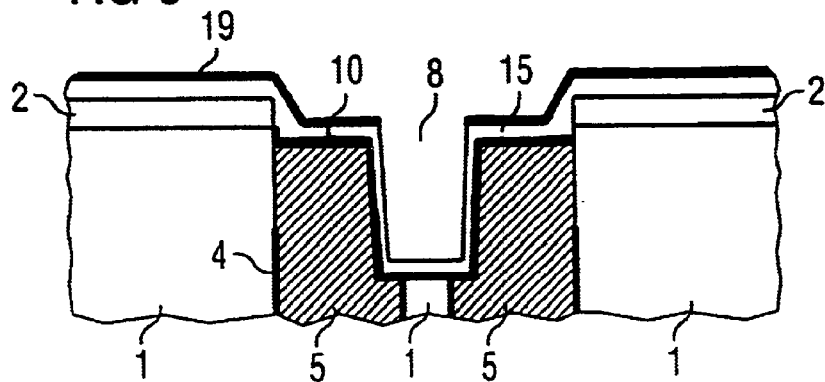
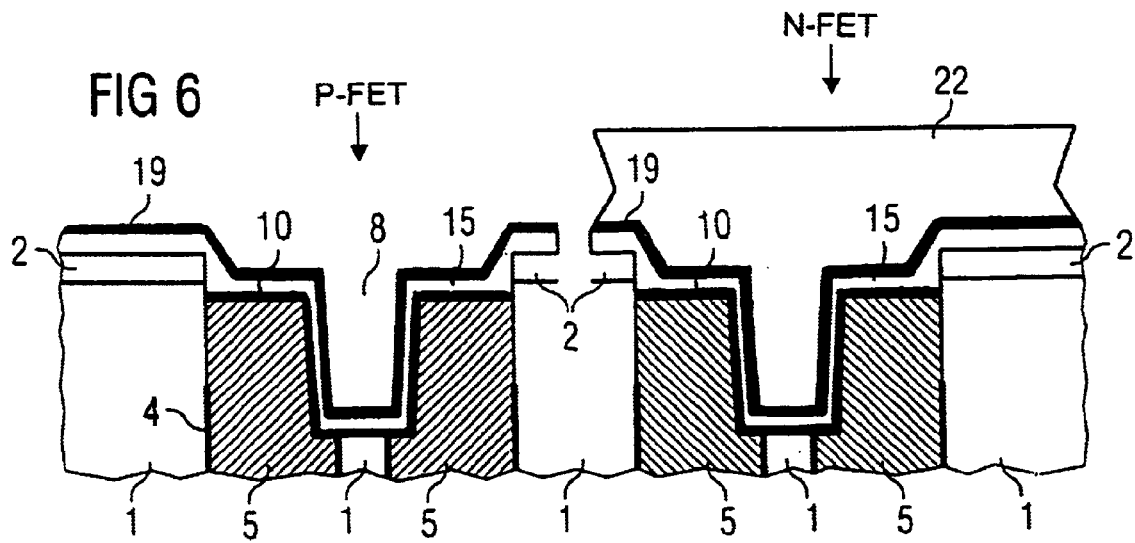

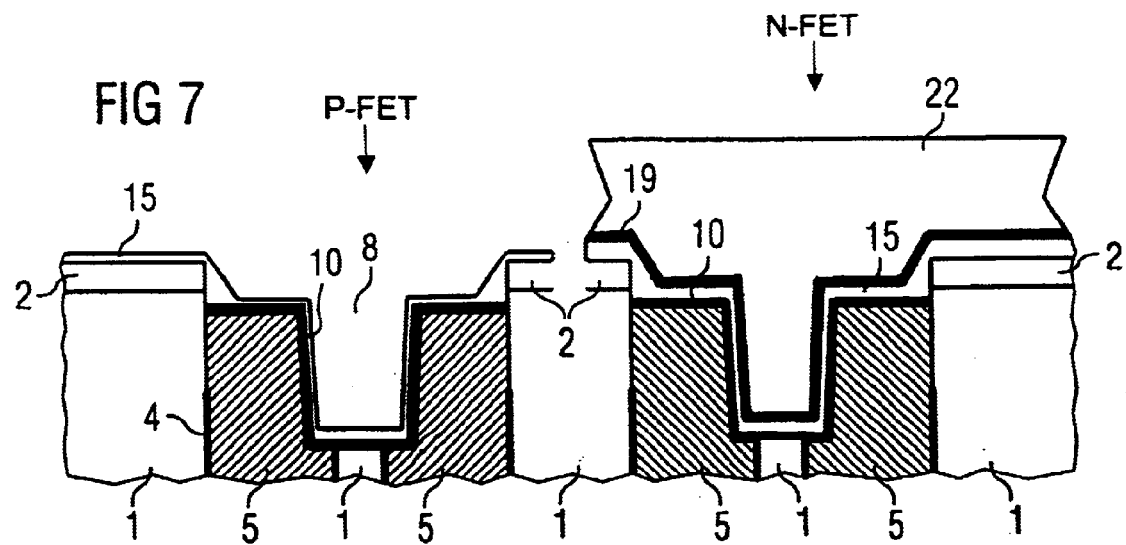
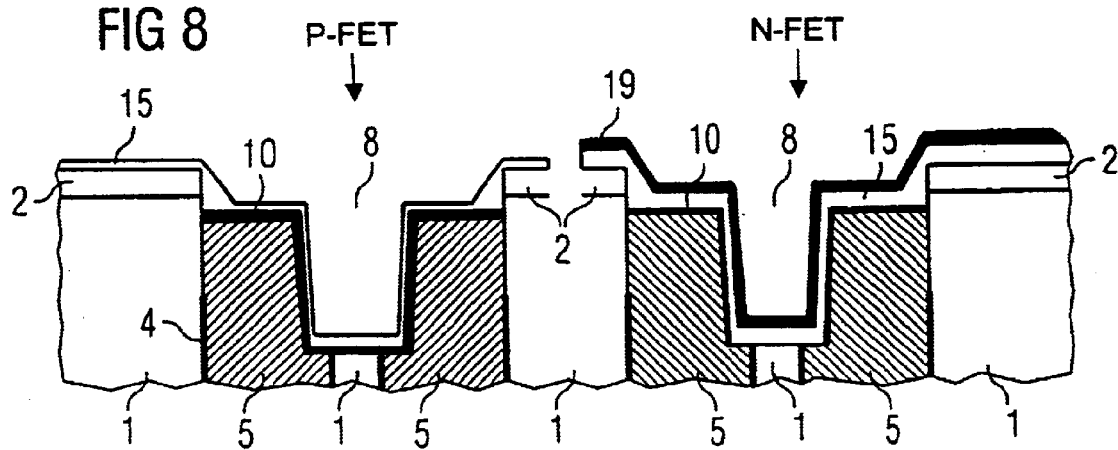

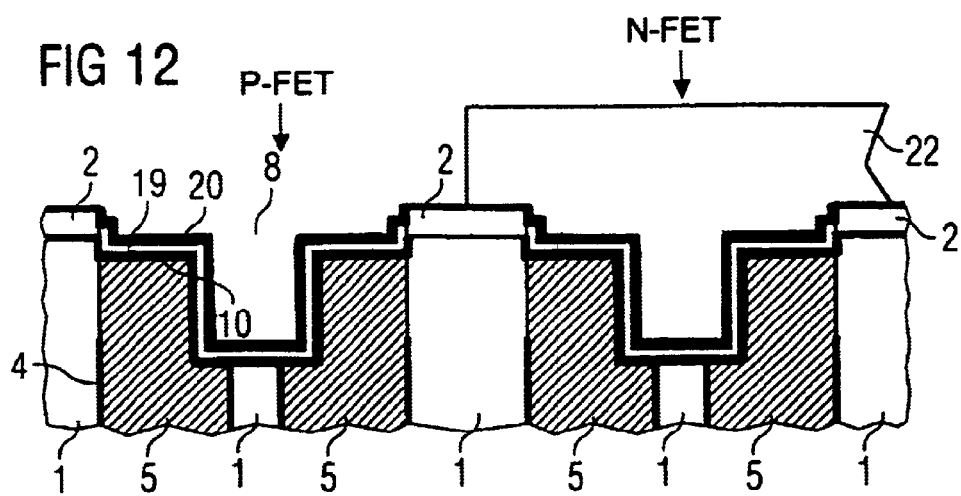
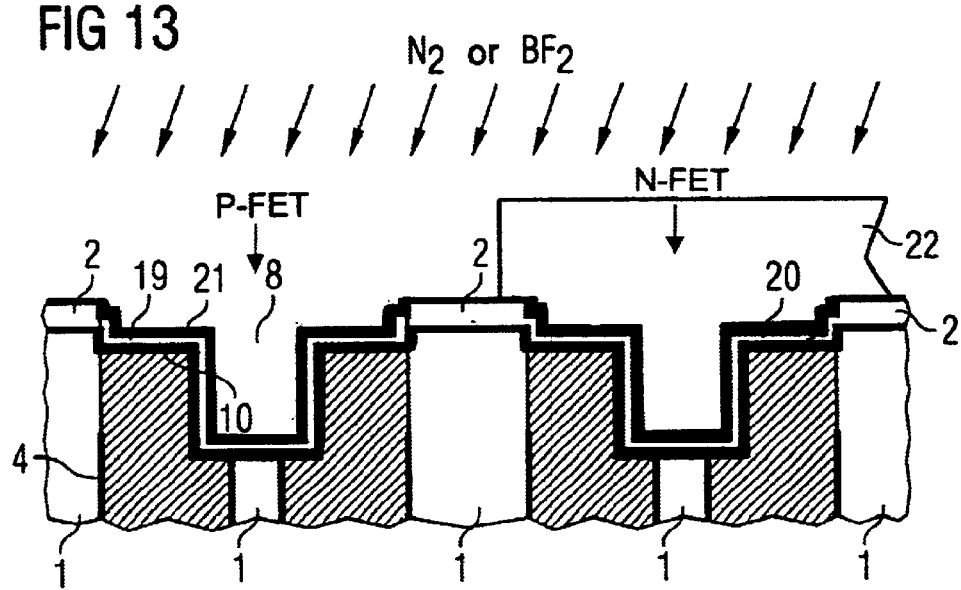
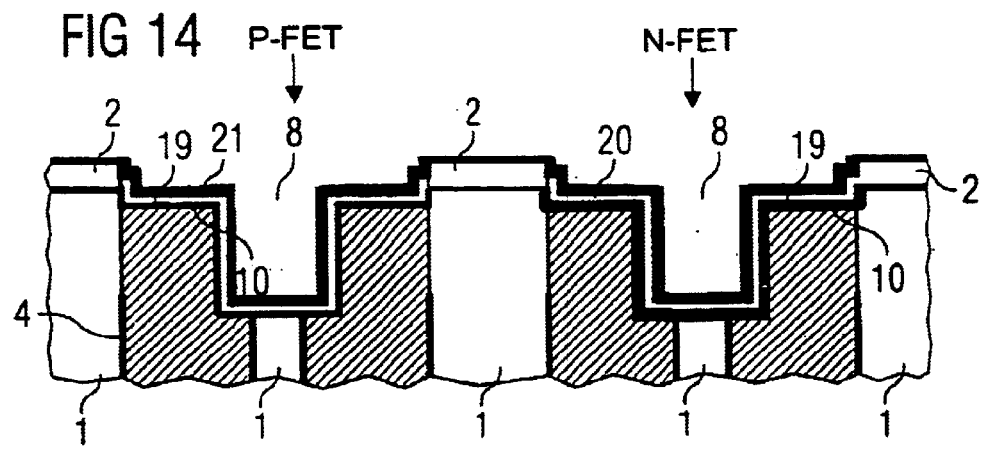

METHOD FOR PRODUCING A SHALLOW TRENCH ISOLATION FOR N- AND P-CHANNEL FIELD-EFFECT TRANSISTORS IN A SEMICONDUCTOR MODULE

BACKGROUND OF THE INVENTION

Field of the Invention

The invention relates to a method for producing a shallow trench isolation for n- and p-channel field-effect transistors in a semiconductor module.

So-called shallow trench isolation (STI) is increasingly being used to isolate active regions on semiconductor modules. STI is used to an increased extent particularly in the more recent memory generations (starting with 16 M through to the present-day 512 M DRAM (Dynamic Random Access Memory) and in new generations of logic modules. The prior art process sequence for STI is that first a trench (shallow trench) is etched into the silicon substrate, and the trench is then partly filled with oxide (TEOS (Tetraethyl orthosilicate) or HDP (High Density Plasma)) and planarized until only the isolation oxide remains in the trench. A nitride liner, which was deposited before the oxide in order to protect the foundation during the further processing, is situated at the isolation edge of each transistor after the STI etching. Hitherto, a nitride liner has been fitted completely to all of the transistors. Although this has led to improved properties in the case of the n-channel transistors, during chemical mechanical polishing (CMP) potassium ions are deposited and shorten the channel, which, in the case of p-channel transistors, has resulted in a breakdown (punch-through) and a degradation of the p-channel transistors. Therefore, more recently the nitride liner has been completely dispensed with, although the positive effect on the n-channel transistors has been lost.

SUMMARY OF THE INVENTION

It is accordingly an object of the invention to provide a method for producing a shallow trench isolation for n- and p-channel field-effect transistors in a semiconductor module, which overcomes the above-mentioned disadvantages of the prior art methods of this general type.

In particular, it is an object of the invention to provide a method for producing a shallow trench isolation for n- and p-channel field-effect transistors in a semiconductor module, which both exploits the advantages of a nitride liner for n-channel transistors and does not entail any impairment for p-channel transistors.

With the foregoing and other objects in view there is provided, in accordance with the invention, a method for producing shallow trench isolations for n-channel field-effect transistors and p-channel field-effect transistors in a semiconductor module. The method includes steps of: forming shallow trench isolation trenches in a substrate for the n-channel field-effect transistors and the p-channel field-effect transistors; applying an oxide layer; applying a nitride layer; producing a mask for covering regions in which the n-channel field-effect transistors will subsequently be formed; removing the nitride layer in regions not covered by the mask; and removing the mask.

In accordance with an added feature of the invention, the oxide layer is a thermal oxide layer.

In accordance with an additional feature of the invention, the method includes applying a further oxide layer between the oxide layer and the nitride layer.

In accordance with another feature of the invention, the further oxide layer is a high-density plasma tetraethyl orthosilicate layer.

In accordance with another added feature of the invention, the further oxide layer is applied thinner at walls of the shallow trench isolation trenches than on horizontal areas of the shallow trench isolation trenches.

In accordance with a further feature of the invention, step of producing the mask includes: applying a further oxide layer to the nitride layer; applying a resist mask in the regions in which the n-channel field-effect transistors will subsequently be formed; implanting $N_2$ into the further oxide layer in the regions not covered by the resist mask; removing the resist mask; and removing the further oxide layer implanted with the $N_2$.

In accordance with a further added feature of the invention, step of producing the mask includes: applying a poly-Si layer to the nitride layer; applying a resist mask in the regions in which the n-channel field-effect transistors will subsequently be formed; implanting $BF_2$ into the poly-Si layer in regions not covered by the resist mask; removing the resist mask; and removing the poly-Si layer implanted with the $BF_2$.

In accordance with another added feature of the invention, step of producing the mask includes: applying a further oxide layer to the nitride layer; applying a resist mask in the regions in which the n-channel field-effect transistors will subsequently be formed; removing the further oxide layer in regions not covered by the resist mask; and removing the resist mask.

In accordance with another additional feature of the invention, step of producing the mask includes: applying a poly-Si layer to the nitride layer; applying a resist mask in the regions in which the n-channel field-effect transistors will subsequently be formed; removing the poly-Si layer in regions not covered by the resist mask; and removing the resist mask.

With the foregoing and other objects in view there is provided, in accordance with the invention, a method for producing shallow trench isolations for n-channel field-effect transistors and p-channel field-effect transistors in a semiconductor memory module. The method include steps of: forming shallow trench isolation trenches in a substrate for the n-channel field-effect transistors and the p-channel field-effect transistors, the substrate being for producing the semiconductor memory module; applying an oxide layer; applying a nitride layer; producing a mask for covering regions in which the n-channel field-effect transistors will subsequently be formed; removing the nitride layer in regions not covered by the mask; and removing the mask.

In accordance with an added feature of the invention, the substrate is for producing a dynamic random access memory.

The inventive solution results in an improvement in the storage duration of the memory cells and an increase in the threshold voltage of the selection transistor, which reduces a cell-to-bitline leakage.

According to the invention, the following steps are performed in order to produce a shallow trench isolation for n- and p-channel field-effect transistors in a semiconductor module. An oxide layer and, above the oxide layer, a nitride layer are applied in isolation trenches present on a substrate. Afterward, a masking is applied and the nitride layer is removed in accordance with the masking. Finally, the masking is also removed.

The following steps are performed in accordance with a preferred embodiment of the inventive method for producing a shallow trench isolation for n- and p-channel field-effect transistors in a semiconductor module. A first oxide layer is applied in isolation trenches present on a substrate. A further oxide layer and a nitride layer are subsequently applied. In a further step, a mask is applied in the region in which an n-channel field-effect transistor is intended to be produced. The nitride layer is removed around the mask. Finally, the mask is also removed.

The following steps are performed in accordance with a further preferred embodiment of the method for producing a shallow trench isolation for n- and p-channel field-effect transistors in a semiconductor module. An oxide layer and a nitride layer and, above the nitride layer, a further oxide layer or a poly-Si layer are applied in isolation trenches present on a substrate. Afterward, a resist mask is applied and the further oxide layer or the poly-Si layer is removed in accordance with the resist mask. In a further step, the nitride layer is likewise removed in the region in which the further oxide layer or the poly-Si layer has been removed.

In accordance with a further preferred embodiment of the method for producing a shallow trench isolation for n- and p-channel field-effect transistors, in order to produce the masking, a further oxide layer or a poly-Si layer is applied to the nitride layer. In a region in which n-channel field-effect transistors are intended to be produced, a resist mask is subsequently applied and $N_2$ or $BF_2$ is implanted into the further oxide layer or the poly-Si layer around the resist mask. Afterward, the resist mask and the further oxide layer implanted with $N_2$ or the poly-Si layer implanted with $BF_2$ are removed.

The method can be used for fabricating a memory module, in particular a dynamic random access memory.

Other features which are considered as characteristic for the invention are set forth in the appended claims.

Although the invention is illustrated and described herein as embodied in a method for producing a shallow trench isolation for n- and p-channel field-effect transistors in a semiconductor module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a cross sectional view of the first embodiment of the semiconductor module after the application of an HDP-TEOS layer;

FIG. 5 is a cross sectional view of the first embodiment of the semiconductor module after the application of a nitride liner;

FIG. 6 is a cross sectional view of the first embodiment of the semiconductor module after the application of a mask;

FIG. 7 is a cross sectional view of the first embodiment of the semiconductor module after the partial removal of the nitride liner;

FIG. 8 is a cross sectional view of the first embodiment of the semiconductor module after the removal of the mask;

FIG. 12 is a cross sectional view of the second embodiment of the semiconductor module after the application of a lithography mask;

FIG. 13 is a cross sectional view of the second embodiment of the semiconductor module during the implantation of $N_2$ or $BF_2$ into the oxide liner;

FIG. 14 is a cross sectional view of the second embodiment of the semiconductor module after the removal of the lithography mask;

DESCRIPTION OF THE PREFERRED EMBODIMENTS

Figure 1:
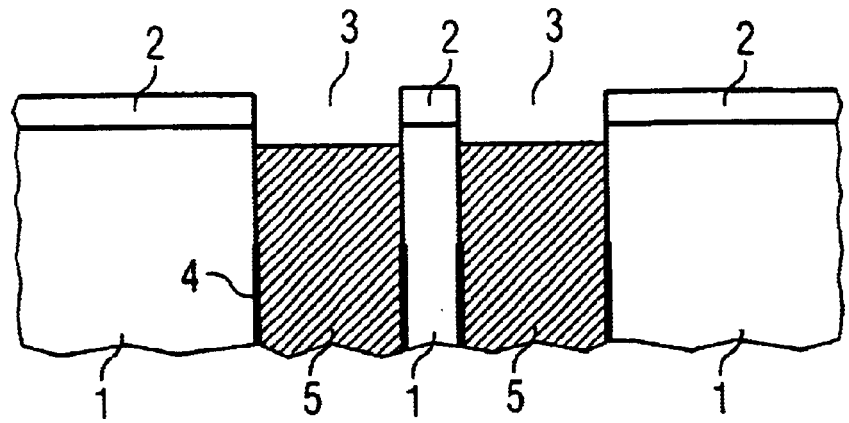
FIG. 1 is a cross sectional view of the basic construction of a first embodiment of a semiconductor module.

The first embodiment of the invention will now be described. Referring now to the figures of the drawing in detail and first, particularly, to FIG. 1 thereof, there is shown the basic construction of a semiconductor module that is suitable for the application of the inventive fabrication method. A pad nitride 2 is arranged on a substrate 1, which is generally a silicon substrate. In the substrate 1 there are two depressions 3 (recesses) present, which are partly filled with a DT poly-Si filling 5. The substrate 1 is situated between and at the sides of the two depressions 3. A DT (deep trench) collar 4 is present in the lower region of the depression 3.

Figure 2:
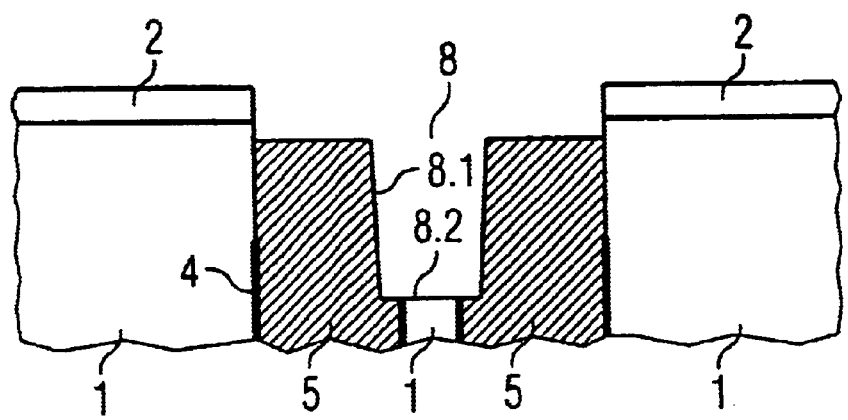
FIG. 2 is a cross sectional view of the first embodiment of the semiconductor module with an isolation trench.

In a further process step, an isolation trench 8 is introduced into the substrate 1 of the semiconductor module. To that end, the DT poly-Si filling 5 and the substrate 1 which is present between the two depressions 3 are partly removed in the region of the two depressions 3. FIG. 2 shows the corresponding construction of the semiconductor module with an isolation trench 8. The DT poly-Si filling 5 and the substrate 1 can be removed by performing a dry etching which is sufficiently known from the prior art.

Figure 3:
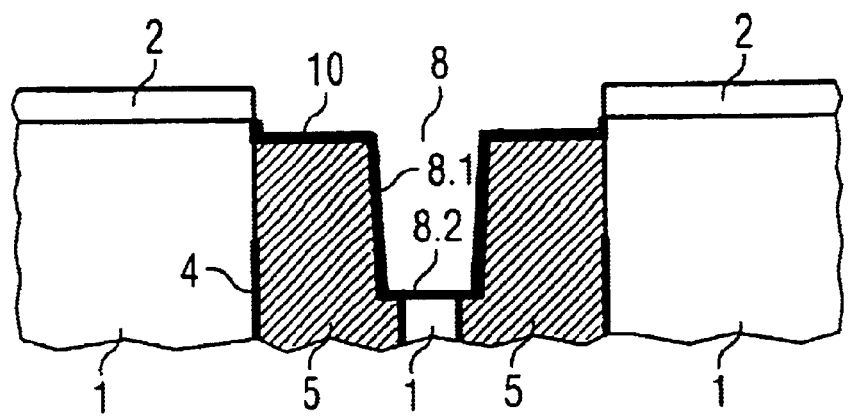
FIG. 3 is a cross sectional view of the first embodiment of the semiconductor module after the application of a layer of thermal oxide.

In a further process step, a thin thermal oxide layer 10 is deposited on the side walls 8.1 and the bottom 8.2 of the isolation trench 8. FIG. 3 shows the construction of the semiconductor module after the application of the thermal oxide 10.

FIG. 4 shows the construction of the semiconductor module after the application of an HDP-TEOS layer 15 (HDP-TEOS=high density plasma tetraethyl orthosilicate). In this case, the HDP-TEOS layer 15 covers the pad nitride 2, the side walls 8.1 and the bottom 8.2 of the isolation trench 8 (The side walls 8.1 and the bottom 8.2 are indicated in FIG. 3).

In this case, the HDP-TEOS layer 15 is applied in such a way that the HDP-TEOS grows more rapidly on horizontal areas than on vertical areas. This can be done by sputtering, for example. A ratio of the vertical to the horizontal layer thickness of approximately 1:8 is ultimately produced. The HDP-TEOS layer 15 serves to protect the edges, for example, against damage due to a dry-chemical etching process which takes place at a later point in time.

FIG. 5 shows the construction of the semiconductor module after the application of a nitride liner 19. The latter covers the HDP-TEOS layer 15.

In a further process step, a resist mask 22 is applied in regions which are later intended to serve as n-channel transistors N-FET. FIG. 6 shows the construction of the semiconductor module after the application of the mask 22. The mask 22 is a lithographic layer for partially covering the nitride liner 19.

FIG. 7 shows the construction of the semiconductor module after the partial removal of the nitride liner 19. In this process step, the nitride liner 19 is removed only where the resist mask 22 does not cover the nitride liner 19.

Finally, the resist mask 22 is removed in a further process step. The corresponding construction of the semiconductor module after the removal of the mask is shown in FIG. 8. What is thus achieved is that the region for the n-channel transistor N-FET has the nitride liner 19, and that the region for the p-channel transistor P-FET does not have the nitride liner 19.

Such a construction first has the advantage that the storage time (retention time) can be increased. Second, this construction also has the advantage of the higher threshold voltages of the transistors. The avoidance of the premature breakdown (punch-through) at the p-channel field-effect transistors in the periphery of a DRAM is to be regarded as a further advantage. The positive properties of the n-channel field-effect transistors in the cell array of the DRAM are preserved, however.

Figure 9:
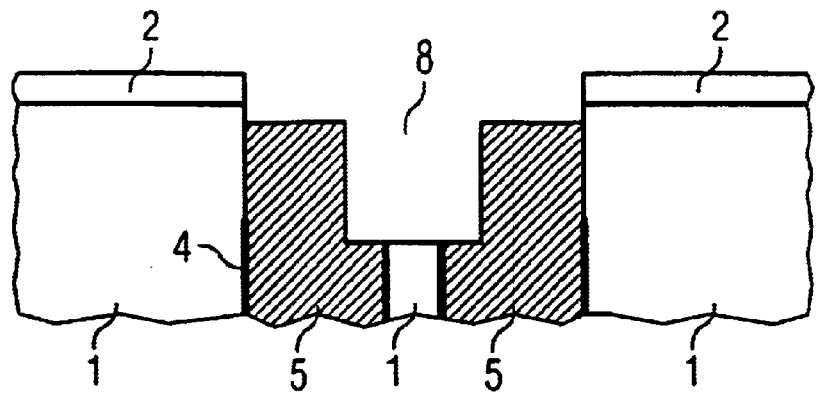
FIG. 9 is a cross sectional view of a second embodiment of the semiconductor module.

The second embodiment of the invention will now be described. FIG. 9 shows the basic construction of a semiconductor module that is suitable for the application of the inventive fabrication method. A pad nitride 2 is applied on a substrate 1. Embedded in the substrate 1 is a DT poly-Si filling 5 having a trench 8. A DT collar 4 is present in the lower region of the DT poly-Si filling 5. The basic construction corresponds to that from the first embodiment in accordance with FIG. 2.

Figure 10:
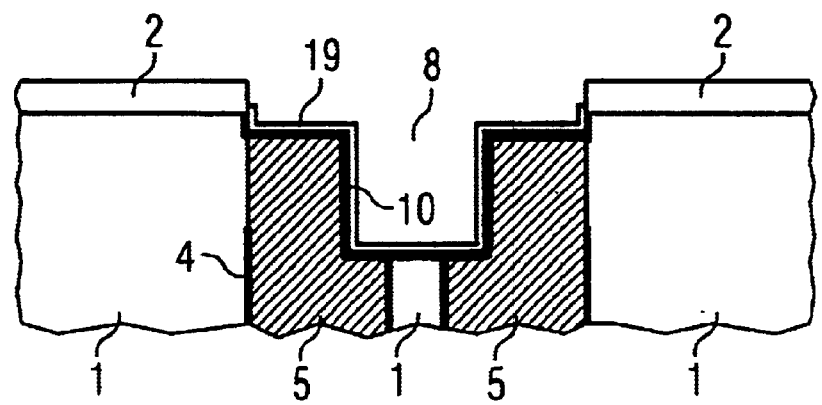
FIG. 10 is a cross sectional view of the second embodiment of the semiconductor module after the application of a thermal oxide and the subsequent application of a nitride liner.

In one process step, a thermal oxide (AAOx) 10 is deposited on the top side of the DT poly-Si filling 5. In a further process step, a nitride liner 19 is deposited on the layer made of thermal oxide 10. FIG. 10 shows the construction of the semiconductor module after the application of the nitride liner 19.

Figure 11:
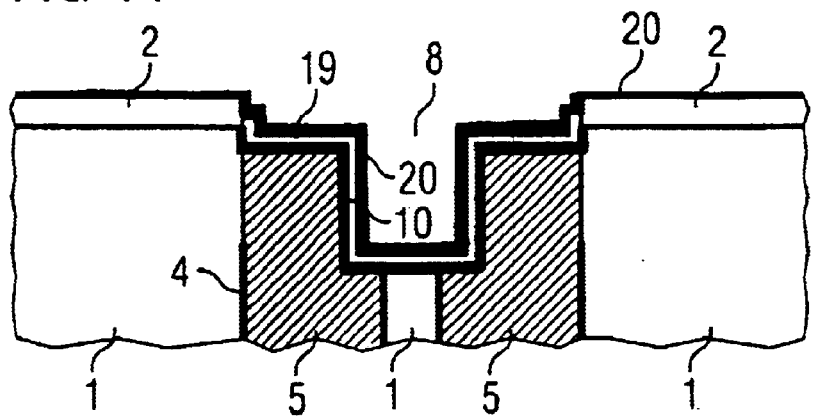
FIG. 11 is a cross sectional view of the second embodiment of the semiconductor module after the application of an oxide liner.

FIG. 11 shows the construction of the semiconductor module after the application of an oxide mask in the form of an oxide or poly-Si liner 20. The latter covers the nitride liner 19 with a layer thickness of approximately 20–40 nm. The oxide mask 20 additionally extends over the pad nitride 2.

A resist mask 22 is subsequently applied in regions which are later intended to serve as n-channel transistors N-FET. FIG. 12 shows the construction of the semiconductor module after the application of the mask 22. The mask 22 is a lithographic layer for partially covering the nitride liner 19. The regions which are later intended to serve as p-channel transistors P-FET remain uncovered.

$N_2$ or $BF_2$ is then implanted into the region of the oxide or poly-Si liner 20 which is not covered by the resist mask 22. An oxide liner 21 implanted with $N_2$ or a poly-Si liner 21 implanted with $BF_2$ is produced. FIG. 13 shows the construction of the semiconductor module after the implantation of $N_2$ or $BF_2$ into the oxide or poly-Si liner 20.

In a further process step, the resist mask 22 is removed. The corresponding construction of the semiconductor module after the removal of the mask 22 is illustrated in FIG. 14.

Figure 15:
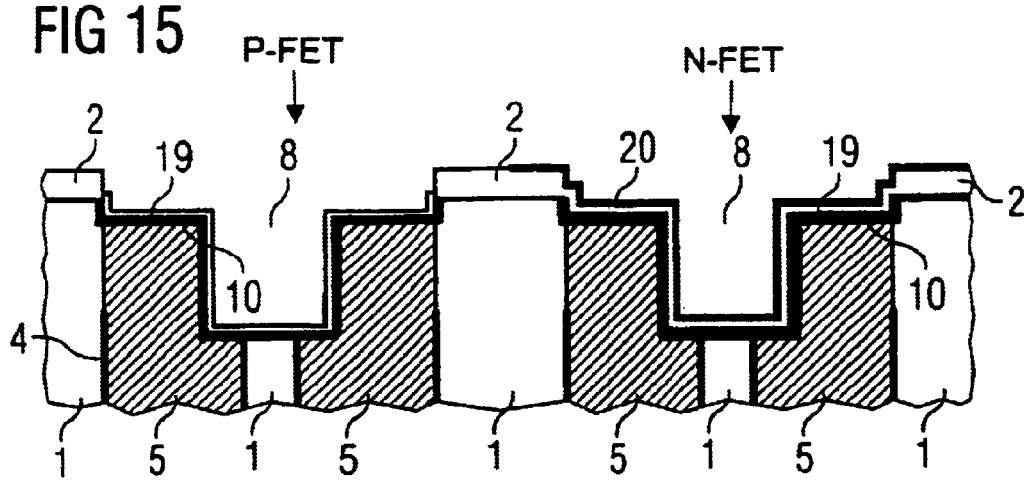
FIG. 15 is a cross sectional view of the second embodiment of the semiconductor module after the removal of the oxide liner implanted with $N_2$ or $BF_2$.

FIG. 15 shows the construction of the semiconductor module after the removal of the oxide or poly-Si liner 21 implanted with $N_2$ or $BF_2$. The implantation of $N_2$ or $BF_2$ into the oxide or poly-Si liner 20 alters the etching rate. During the etching, the oxide or poly-Si liner 20 is etched away significantly more slowly than the oxide or poly-Si liner 21 implanted with $N_2$ or $BF_2$. As a result, the nitride liner 19 is uncovered in the regions provided for the p-channel transistors P-FET, while it remains covered in the regions provided for the n-channel transistors N-FET with the oxide or poly-Si liner 20 which, even though it is somewhat thinner, is nonetheless still present to a sufficient extent. The oxide or poly-Si liner 20 not implanted with $N_2$ or $BF_2$ thus serves as a mask for the subsequent process step.

Figure 16:
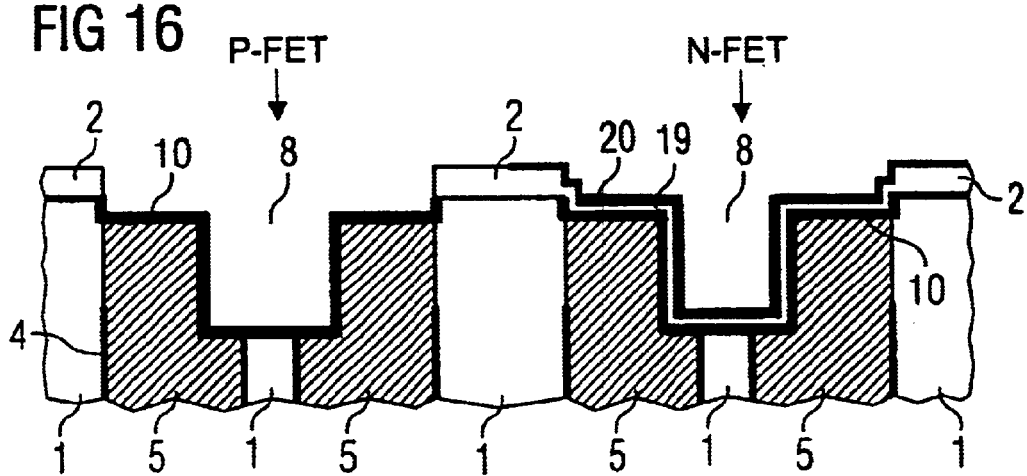
FIG. 16 is a cross sectional view of the second embodiment of the semiconductor module after the partial removal of the nitride liner.

In the subsequent etching process, the uncovered nitride liner 19 is removed. An appropriate etching process is either a dry or wet etching. Both etching processes are sufficiently known from the prior art. FIG. 16 shows the construction of the semiconductor module after the partial removal of the nitride liner 19.

Figure 17:
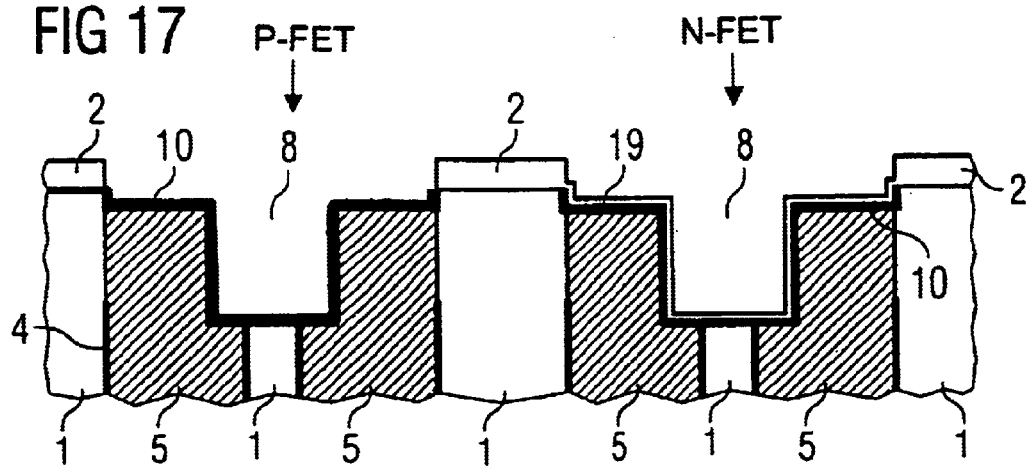
FIG. 17 is a cross sectional view of the second embodiment of the semiconductor module after the removal of the residual oxide liner.

FIG. 17 shows the construction of the semiconductor module after the removal of the residual oxide liner 20.

Such a construction, like the construction described in the first embodiment of the invention as well, first has the advantage that the storage time can be increased. Second, this construction also has the advantage of higher threshold voltages of the transistors. The increase in the breakdown voltage (punch-through voltage) at the p-channel field-effect transistors in the periphery of a DRAM is regarded as a further advantage. The positive properties of the n-channel field-effect transistors in the cell array of the DRAM are preserved, however.

Figure 18:
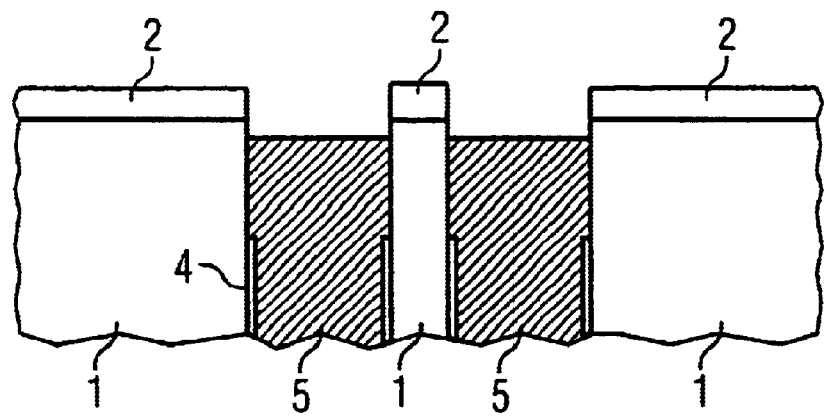
FIG. 18 is a cross sectional view of a third embodiment of the semiconductor module.

The third embodiment of the invention will now be described. FIG. 18 shows the basic construction of a semiconductor module that is suitable for the application of the inventive fabrication method. A pad nitride 2 is applied on a substrate 1. In the substrate 1 there are two depressions 3 present which lie next to one another and are partly filled with a DT poly-Si filling 5. The substrate 1 is likewise situated between the two depressions 3. A DT collar 4 is present in the lower region of the depression 3. The basic construction corresponds to that from the first embodiment in accordance with FIG. 1.

Figure 19:
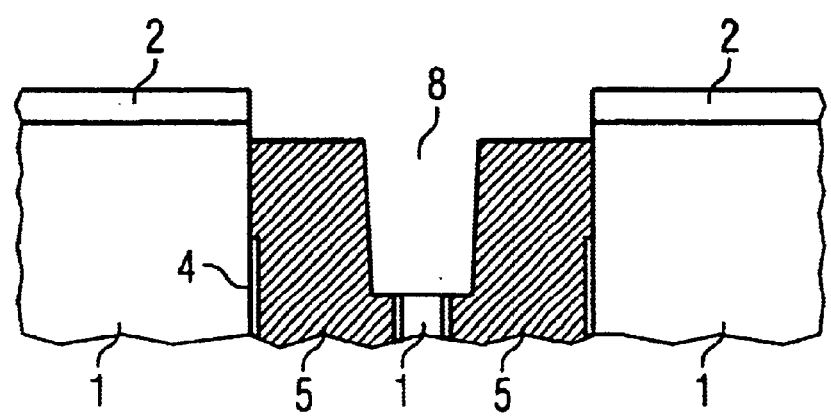
FIG. 19 is a cross sectional view of the third embodiment of the semiconductor module after the STI etching.

In a further process step, an isolation trench 8 is produced by performing an STI etching. FIG. 19 shows the construction of the semiconductor module after the STI etching. The construction corresponds to those from the first and second embodiments in accordance with FIGS. 2 and 9, respectively.

Figure 20:
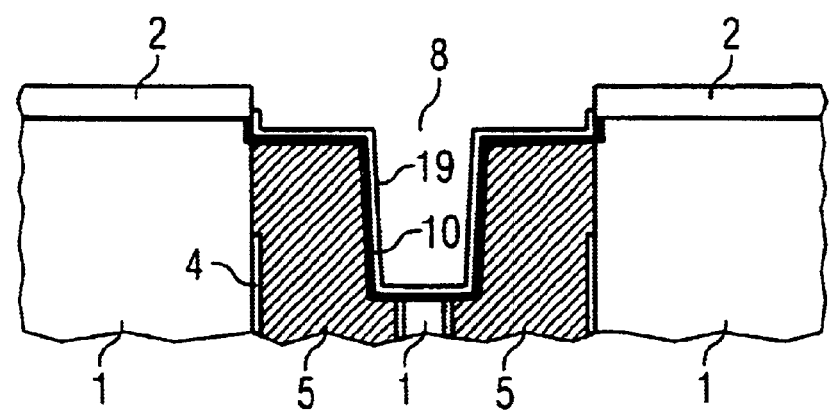
FIG. 20 is a cross sectional view of the third embodiment of the semiconductor module after the application of an oxide liner (AAOx deposition) and a nitride liner.

FIG. 20 shows the construction of the semiconductor module after the application of a thermal oxide liner 10 and a nitride liner 19. The latter covers the oxide liner 10.

Figure 21:
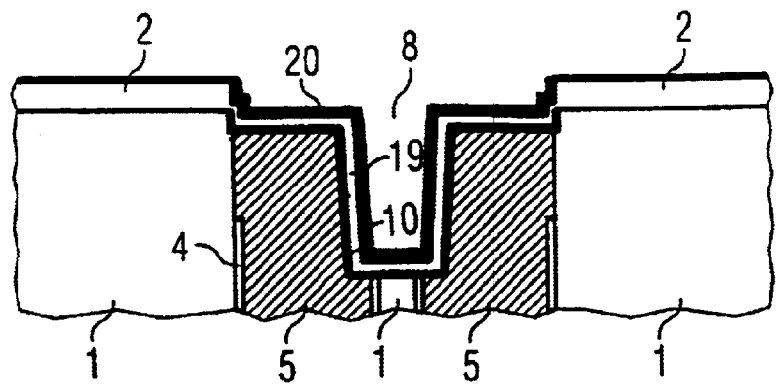
FIG. 21 is a cross sectional view of the third embodiment of the semiconductor module after the application of an oxide or poly-Si liner.

In the next process step, a conformal oxide or poly-Si liner 20 is deposited over the nitride liner 19. The corresponding construction after this process step has been carried out is shown in FIG. 21.

Figure 22:
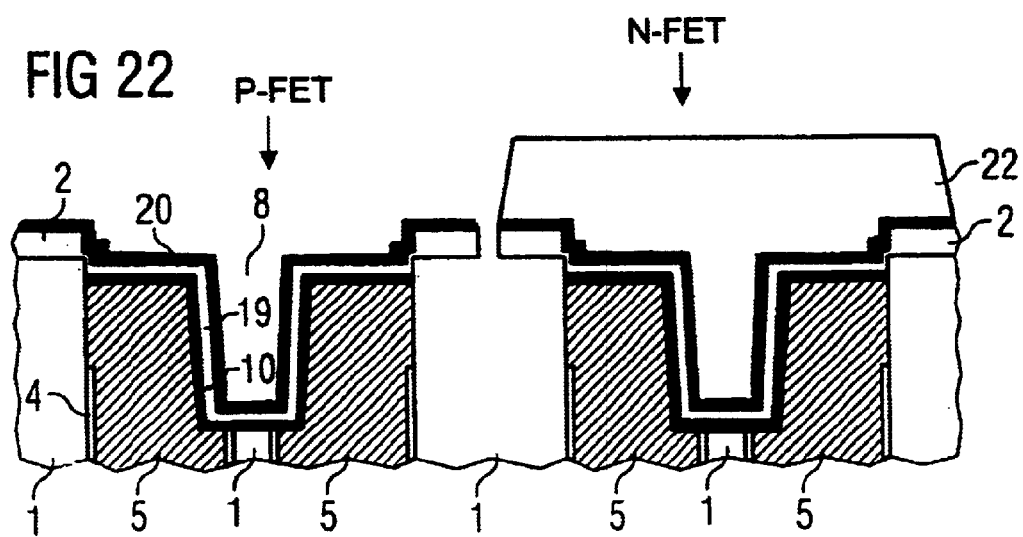
FIG. 22 is a cross sectional view of the third embodiment of the semiconductor module after the application of a mask.

A resist mask 22 is subsequently applied in regions which are later intended to serve as n-channel transistors N-FET. FIG. 22 shows the construction of the semiconductor module after the application of the mask 22. The mask 22 is a lithographic layer for partially covering the oxide layer 20.

In this respect, the two embodiments two and three of the invention essentially correspond.

Figure 23:
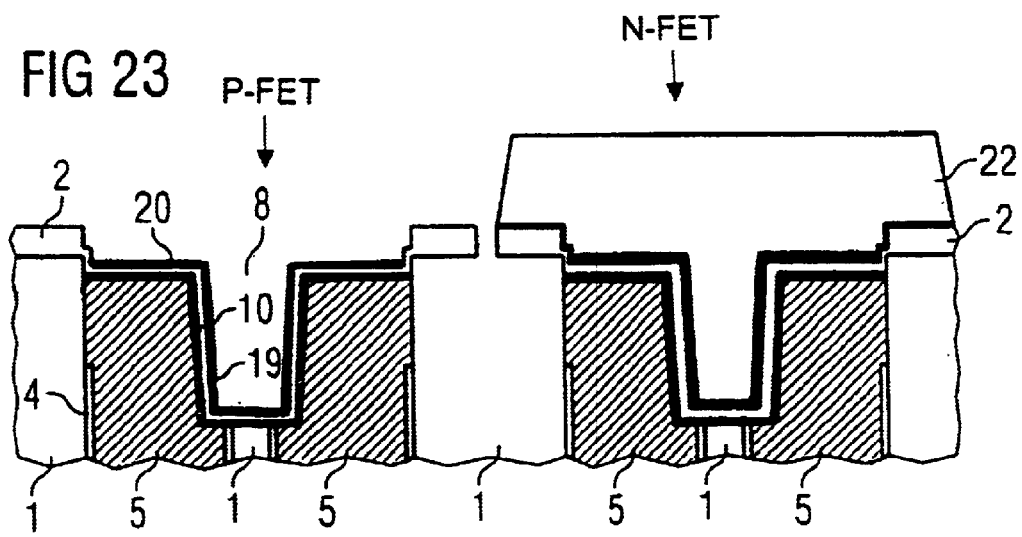
FIG. 23 is a cross sectional view of the third embodiment of the semiconductor module after the partial removal of the oxide liner.

The part of the oxide or poly-Si liner 20 which is not covered by the resist mask 22 is then removed by performing a wet-chemical etching method. FIG. 23 shows the construction of the semiconductor module after the partial removal of the oxide or poly-Si liner 20.

Figure 24:
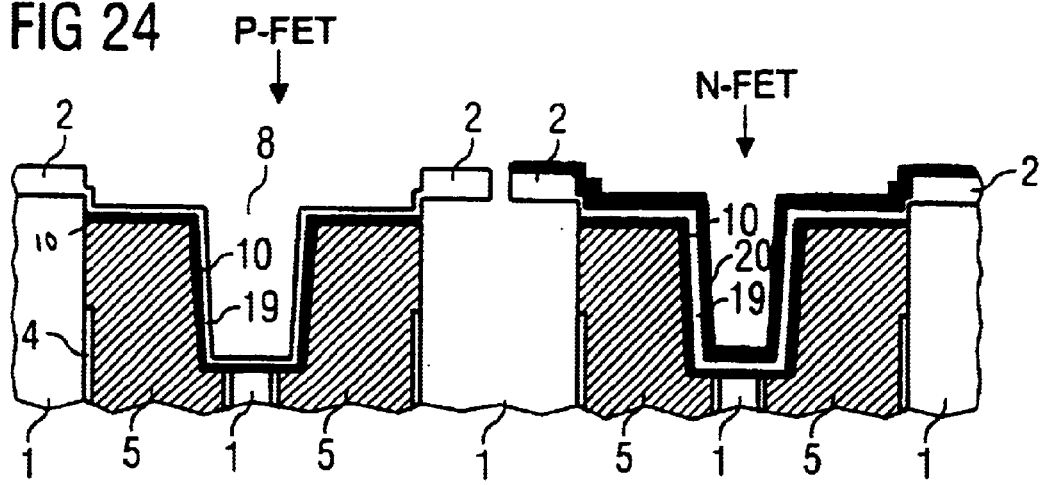
FIG. 24 is a cross sectional view of the third embodiment of the semiconductor module after the removal of the mask (resist strip)

The resist mask 22 is removed in a further process step. The corresponding construction of the semiconductor after these process steps have been carried out is shown in FIG. 24. The nitride liner 19 is now only situated below the oxide liner 20, that is to say in the region in which an n-channel transistor N-FET is later intended to be-formed.

Figure 25:
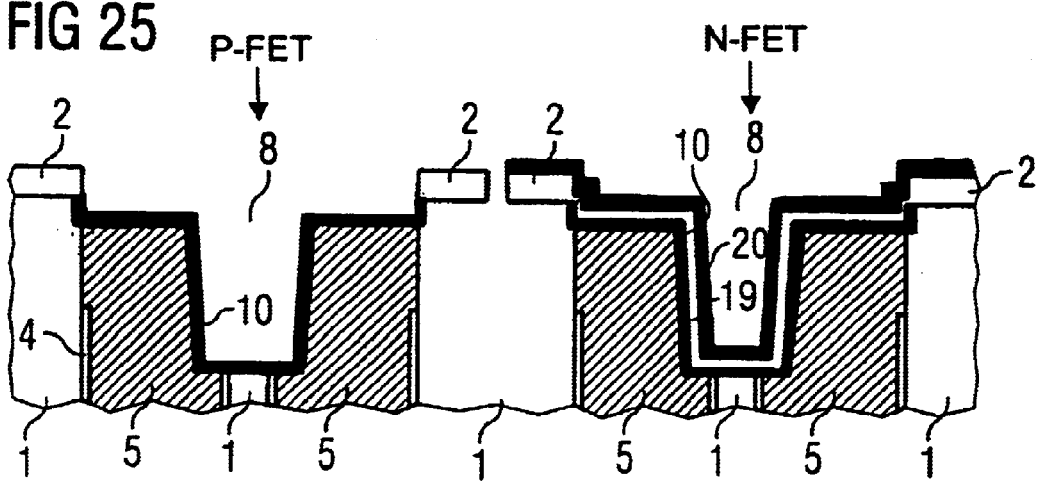
FIG. 25 is a cross sectional view of the third embodiment of the semiconductor module after the etching-away of the nitride liner.

The nitride liner 19 is subsequently removed wet-chemically at the locations at which it is not covered by the oxide liner 20. The resulting layer construction is illustrated in FIG. 25.

Figure 26:
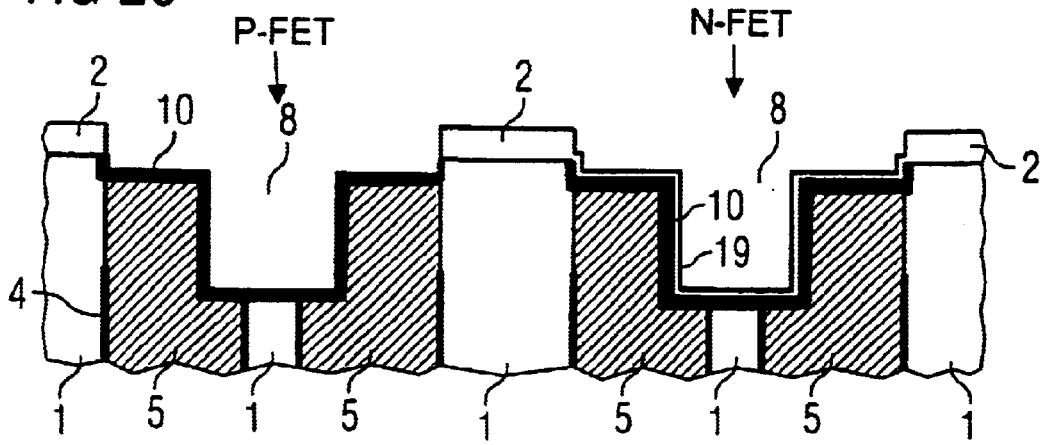
FIG. 26 is a cross sectional view of the third embodiment of the semiconductor module after the removal of the residual oxide liner.

FIG. 26 shows the construction of the semiconductor module after the removal of the residual oxide or poly-Si liner 20. This process step is optional.

The construction in accordance with the third embodiment of the invention, like the construction described in the first and second embodiments of the invention as well, first has the advantage that the storage time can be increased. Second, this construction also has the advantage of the higher threshold voltages of the transistors. The avoidance of a premature breakdown at the p-channel field-effect transistors in the periphery of a DRAM is regarded as a further advantage. The positive properties of the n-channel field-effect transistors in the cell array of the DRAM are preserved, however. Compared with the second embodiment of the invention, the process described last has the advantage that fewer process steps are necessary overall, which entails cost and time savings.

We claim:

1. A method for producing shallow trench isolations for n-channel field-effect transistors and p-channel field-effect transistors in a semiconductor module, the method which comprises:

forming shallow trench isolation trenches in a substrate for the n-channel field-effect transistors and the p-channel field-effect transistors;

applying an oxide layer;

applying a further oxide layer above the oxide layer;

applying a nitride layer above the further oxide layer;

producing a mask for covering regions in which the n-channel field-effect transistors will subsequently be formed;

removing the nitride layer in regions not covered by the mask; and removing the mask.

2. The method according to claim 1, wherein the oxide layer is a thermal oxide layer.

3. The method according to claim 1, wherein the further oxide layer is a high-density plasma tetraethyl orthosilicate layer.

4. The method according to claim 1, wherein the further oxide layer is applied thinner at walls of the shallow trench isolation trenches than on horizontal areas of the shallow trench isolation trenches.

5. The method according to claim 1, which comprises performing the step of producing the mask by:

applying an additional oxide layer to the nitride layer;

applying a resist mask in the regions in which the n-channel field-effect transistors will subsequently be formed;

removing the additional oxide layer in regions not covered by the resist mask; and removing the resist mask.

6. The method according to claim 1, which comprises performing the step of producing the mask by:

applying a poly-Si layer to the nitride layer;

applying a resist mask in the regions in which the n-channel field-effect transistors will subsequently be formed;

removing the poly-Si layer in regions not covered by the resist mask; and removing the resist mask.

7. A method for producing shallow trench isolations for n-channel field-effect transistors and p-channel field-effect transistors in a semiconductor module, the method which comprises:

forming shallow trench isolation trenches in a substrate for the n-channel field-effect transistors and the p-channel field-effect transistors;

applying an oxide layer;

applying a nitride layer;

producing a mask for covering regions in which the n-channel field-effect transistors will subsequently be formed, by the steps of:

applying a poly-Si layer to the nitride layer;

applying a resist mask in the regions in which the n-channel field-effect transistors will subsequently be formed;

implanting $BF_2$ into the poly-Si layer in regions not covered by the resist mask;

removing the resist mask; and removing the poly-Si layer implanted with the $BF_2$;

removing the nitride layer in regions not covered by the mask; and removing the mask.

8. A method for producing shallow trench isolations for n-channel field-effect transistors and p-channel field-effect transistors in a semiconductor module, the method which comprises:

forming shallow trench isolation trenches in a substrate for the n-channel field-effect transistors and the p-channel field-effect transistors;

applying an oxide layer;

applying a nitride layer;

producing a mask for covering regions in which the n-channel field-effect transistors will subsequently be formed, by the steps of:

applying a further oxide layer to the nitride layer;

applying a resist mask in the regions in which the n-channel field-effect transistors will subsequently be formed;

implanting $N_2$ into the further oxide layer in the regions not covered by the resist mask;

removing the resist mask; and removing the further oxide layer implanted with the $N_2$;

removing the nitride layer in regions not covered by the mask; and removing the mask.

9. A method for producing shallow trench isolations for n-channel field-effect transistors and p-channel field-effect transistors in a semiconductor memory module, the method which comprises:

forming shallow trench isolation trenches in a substrate for the n-channel field-effect transistors and the p-channel field-effect transistors, the substrate being for producing the semiconductor memory module;

applying an oxide layer;

applying a further oxide layer above the oxide layer;

applying a nitride layer above the further oxide layer;

producing a mask for covering regions in which the n-channel field-effect transistors will subsequently be formed;

removing the nitride layer in regions not covered by the mask; and removing the mask.

10. The method according to claim 9, wherein the substrate is for producing a dynamic random access memory.

* * * * *